US009081446B2

(12) United States Patent
Liu et al.

(10) Patent No.: US 9,081,446 B2
(45) Date of Patent: Jul. 14, 2015

(54) TOUCH DISPLAY PANELS AND MANUFACTURE METHODS THEREOF

(75) Inventors: Chia-Mei Liu, Miao-Li (TW); Tsai-Lai Cheng, Miao-Li (TW); Wei-Lun Liao, Miao-Li (TW); Guan-Hua Yeh, Miao-Li (TW); Hong-Gi Wu, Miao-Li (TW)

(73) Assignee: INNOLUX CORPORATION, Miao-Li County (TW)

( * ) Notice: Subject to any disclaimer, the term of this patent is extended or adjusted under 35 U.S.C. 154(b) by 1258 days.

(21) Appl. No.: 12/878,951

(22) Filed: Sep. 9, 2010

(65) Prior Publication Data
US 2011/0063238 A1 Mar. 17, 2011

(30) Foreign Application Priority Data
Sep. 15, 2009 (CN) .......................... 2009 1 0307037

(51) Int. Cl.
G06F 3/041 (2006.01)
G06F 3/044 (2006.01)
H01L 27/12 (2006.01)
H01L 27/13 (2006.01)
(52) U.S. Cl.
CPC .............. G06F 3/044 (2013.01); G06F 3/0412 (2013.01); H01L 27/12 (2013.01); H01L 27/1214 (2013.01); H01L 27/13 (2013.01)
(58) Field of Classification Search
CPC ....... G06F 3/0412; G06F 3/044; H01L 27/13; H01L 27/1214; H01L 27/12
See application file for complete search history.

(56) References Cited

U.S. PATENT DOCUMENTS

| 6,507,337 | B1 | 1/2003 | Sato et al. |
| 2006/0262099 | A1 | 11/2006 | Destura et al. |
| 2008/0048994 | A1* | 2/2008 | Lee et al. ...................... 345/173 |
| 2010/0060600 | A1* | 3/2010 | Wang et al. ................... 345/173 |
| 2010/0134429 | A1* | 6/2010 | You et al. ...................... 345/173 |

FOREIGN PATENT DOCUMENTS

CN 1839368 A 9/2006

* cited by examiner

Primary Examiner — Ariel Balaoing
(74) Attorney, Agent, or Firm — Bacon & Thomas, PLLC

(57) ABSTRACT

A touch display panel is provided and includes a substrate, a plurality of gate lines, a plurality of data lines, a plurality of data output lines, a plurality of thin film transistors, and a plurality of detection capacitors. The gate lines are disposed on the substrate. The data lines are disposed on the substrate. The data lines and the gate lines define a plurality of pixel regions on the substrate. The data output lines are disposed on the substrate, and each data output line is disposed next to one data line. The thin film transistors are respectively disposed in the pixel regions. Each thin film transistor is electrically connected to the corresponding gate line and the corresponding data line. The detection capacitors are respectively disposed in the pixel regions. Each detection capacitor is electrically connected to the corresponding gate line and the corresponding data line.

14 Claims, 13 Drawing Sheets

TOUCH DISPLAY PANELS AND MANUFACTURE METHODS THEREOF

BACKGROUND

1. Field of the Disclosure

The disclosure relates to a touch display panel, and more particularly to a touch display panel with capacitive light-sensing structure.

2. Description of Related Art

In currently various consumer electronics products, many portable electronics products, such as a personal digital assistant (PDA), a mobile phone, and a notebook, personal computers, and digital home appliance systems employ touch display panels to serve as interface tool between users and the electronics products. When using a touch display panel, users can perform operation and issue commands directly through objects shown on the panel, which allows batter human operation interface. Currently, electronics products are developed toward light, thin, short, and small design. Thus, it is desired to save the space occupied to dispose conventional input devices, such as buttons, keyboards, and mice in design of electronics products. A display device with a touch display panel becomes one of critical components of various electronics products.

According to structure characteristics, touch display panels are divided into on-cell touch display panels and in-cell touch display panels. An on-cell touch display panel comprises not only a display panel but also a touch panel disposed on the display panel, so that while users watch images displayed on the display panel, the touch panel can detect the locations touched by the users. An in-cell touch display panel integrates a touch function into a conventional display panel, and, thus, a panel has an input function and an output function. The operation interface of an in-cell display touch is more instinctive than that of an on-cell display touch panel. Further, since an in-cell display panel does not require an additional touch layer, compared with an on-cell display panel, the in-cell display panel has provides batter display quality, low power consumption, and short and thin size, which is current development trend of touch display panel.

In conventional in-cell touch display panel technique, a sensing element, such as a light-sensing element, is integrated into a thin film transistor (TFT) array. In other words, a sensing element and conventional TFTs are integrated into one pixel. By different driving signals and detection signals, a display function and a touch detection function can be accomplished in one pixel. Generally, a light sensing element uses a characteristic of that a semiconductor material (such as amorphous silicon) generates photo-charges after illuminated by light, and a touch location can be detected by detecting the generation of the photo-current. A conventional light-sensing element comprises a amorphous silicon TFT or a P-inrtinsic-n (PIN) photodiode, wherein both of the amorphous silicon TFT and the P-inrtinsic-n (PIN) photodiode can be successfully integrated into current liquid crystal display panels. However, there are some drawbacks about the integration. For example, when a light-sensing element is formed based on the structure of a amorphous silicon TFT, since the amorphous silicon TFT is exposed to light for a long time, the photoelectric effect of the amorphous silicon material declines gradually, which results degradation of the capability of sensing light. When a light-sensing element based on the structure of a PIN photodiode, since the polycrystalline silicon has worse light-absorbing efficiency, the detection sensitivity is not desirable in the environment with insufficient light.

SUMMARY

An exemplary embodiment of a touch display panel comprises a substrate, a plurality of gate lines, a plurality of data lines, a plurality of data output lines, a plurality of thin film transistors, and a plurality of detection capacitors. The gate lines are disposed on the substrate. The data lines are disposed on the substrate. The data lines and the gate lines define a plurality of pixel regions on the substrate. The data output lines are disposed on the substrate, and each data output line is disposed next to one data line. The thin film transistors are respectively disposed in the pixel regions. Each thin film transistor is electrically connected to the corresponding gate line and the corresponding data line. The detection capacitors are respectively disposed in the pixel regions. Each detection capacitor is electrically connected to the corresponding gate line and the corresponding data line.

Another exemplary embodiment of a touch display panel comprises a substrate, a plurality of gate lines, a plurality of data lines, a plurality of detection scan lines, a plurality of common lines, a plurality of thin film transistors, a plurality of auxiliary transistors, and a plurality of detection capacitors. The gate lines are disposed on the substrate. The data lines are disposed on the substrate. The data lines and the gate lines define a plurality of pixel regions on the substrate. The detection scan lines are disposed on the substrate, and each detection scan line is disposed next to one data line. The common lines are disposed on the substrate. The thin film transistors are respectively disposed in the pixel regions. Each thin film transistor is electrically connected to the corresponding gate line and the corresponding data line. The auxiliary transistors are respectively disposed in the pixel regions. Each auxiliary transistor is electrically connected to the corresponding detection scan line and the corresponding data line. The detection capacitors are respectively disposed in the pixel regions. Each detection capacitor is electrically connected to the corresponding common line and the corresponding auxiliary transistor.

An exemplary embodiment of a manufacture method of a touch display panel comprises the steps of providing a substrate; forming a gate and a first electrode on the substrate; forming a dielectric layer on the substrate to cover the gate and the first electrode; forming a channel layer on a portion of the dielectric layer which is over the gate and forming a second electrode on a portion of the dielectric layer which is over the first electrode; forming a source and a drain on the channel layer and forming an output electrode on the second electrode; forming a protection layer on the substrate and forming a via hole on the protection layer, wherein the via hole is disposed on the drain; and forming a pixel electrode on the substrate, wherein the pixel electrode is electrically connected to the drain through the via hole.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
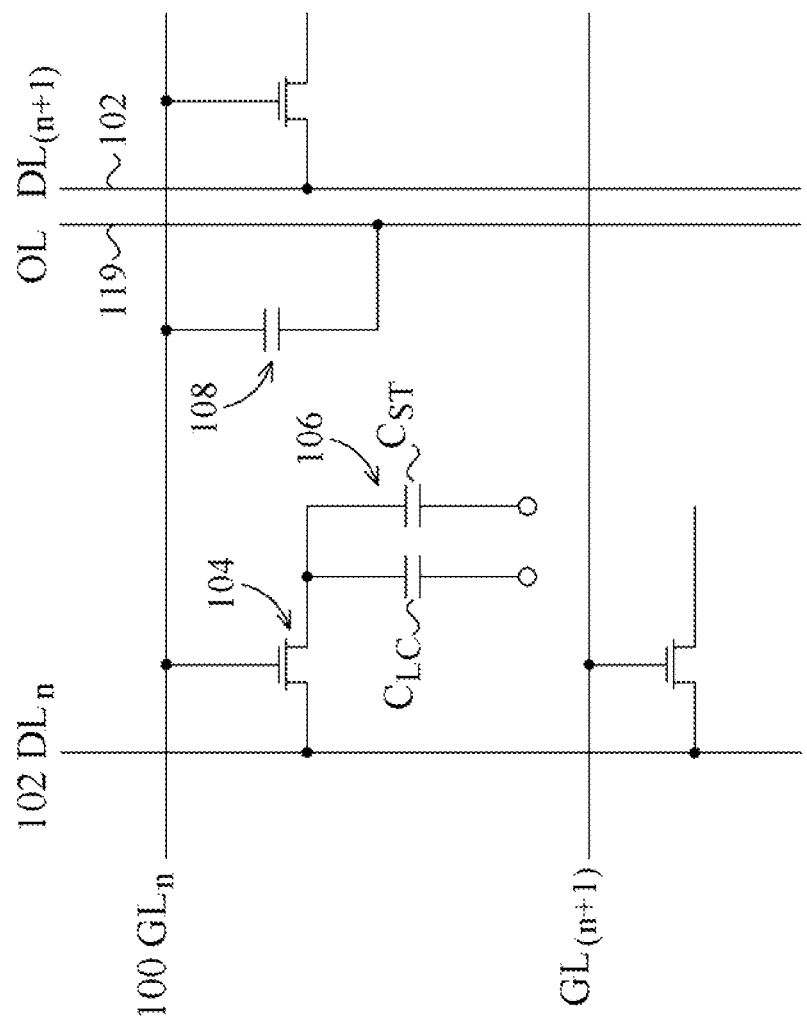
FIG. 1 shows an equivalent circuit of an exemplary embodiment of a touch display panel.
Figure 2:
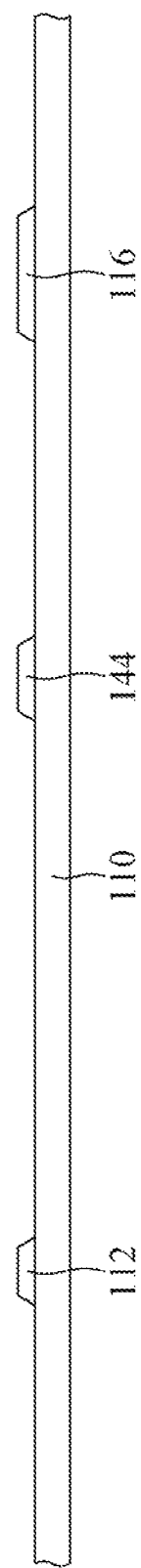
FIGS. 2-6 show a manufacture method of an exemplary embodiment of a touch display panel.
Figure 6:
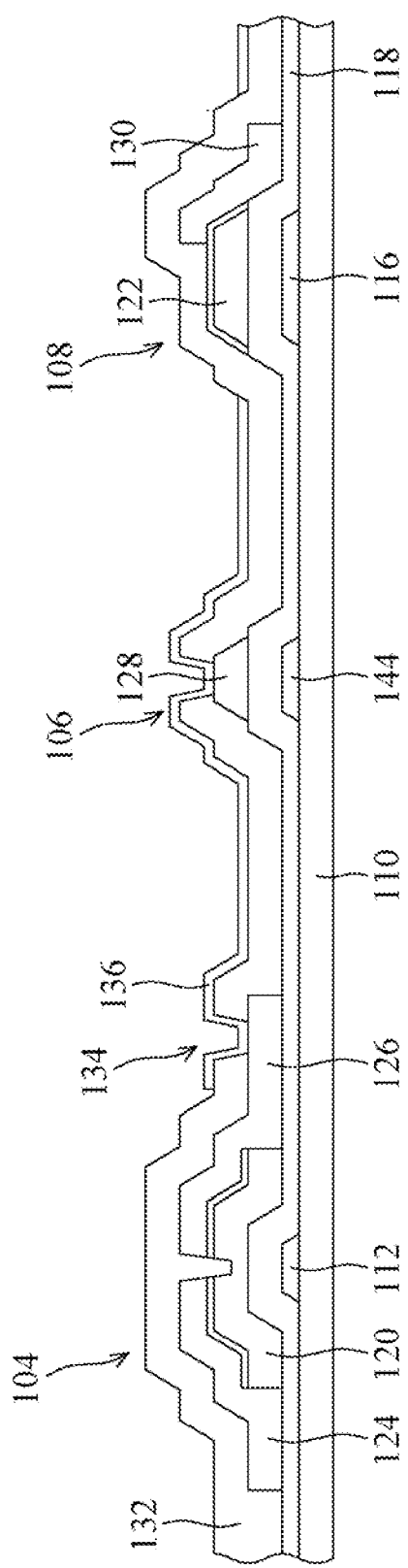

FIG. 1 shows an equivalent circuit of an exemplary embodiment of a touch display panel. FIG. 6 is a cross-sectional view of the touch display panel in FIG. 1. As shown in FIG. 1, a plurality of gate lines ($GL_n$, $GL_{(n+1)}$) 100, a plurality of data lines ($DL_n$, $DL_{(n+1)}$) 102, and a plurality of data output lines (OL) 119 are disposed on substrate of the touch display panel. A region surrounded by two adjacent gate lines 100 and two adjacent data lines 102 is defined as a single pixel. Each data output line 119 is disposed next to one corresponding data line 102 and parallel with the corresponding data line 102. Each pixel comprises a thin film transistor 104 and a storage capacitor ($C_{ST}$) 106. According to FIGS. 1 and 6, the thin film transistor 104 has a gate 112 electrically connected to one corresponding gate line 100, a source 124 electrically connected to one corresponding data line 102, and a drain 126 electrically connected to a pixel electrode 136. The storage capacitor 106 has a bottom storage electrode 144 electrically connected to a common line (not shown) and a top storage electrode 128 electrically connected to the pixel electrode 136. Thus, by applying an appropriate voltage to one gate line 100, the corresponding gate 112 is thus turned on. A signal on the corresponding data line 102 can be conducted to the pixel electrode 136 through the thin film transistor 104, and liquid crystal molecules in the pixel region are thus driven to change light polarization state for accomplishing displaying. Further, the storage capacitor 106 performs potential storage to maintain the driving effect of the pixel electrode 136.

Note that in order to achieve the detection purpose of an in-cell touch display panel, in the embodiment, there are further comprising a detection capacitors 108 formed on the substrate. In the embodiment, one detection capacitor 108 can be disposed in a group of pixels with a fixed number. For example, one detection capacitor 108 is disposed in each 2×2 pixel region. Certainly, one detection capacitor 108 can be disposed in each pixel. The disposition of the detection capacitors 108 can be modified based on consideration to detection density of different products. Referring to FIGS. 1 and 6, from the bottom to the top of the structure of one detection capacitor 108, there are a first electrode 116, a dielectric layer 118, a second electrode 122, and an output electrode 130. The first electrode 116 is electrically connected to the corresponding gate line 100, and the second electrode 122 is electrically connected to the corresponding data output line 119. The first electrode 116 is a metal conductive layer, and the material of the first electrode 16 is copper, aluminum, or other conductive materials, for instance. The dielectric layer 118 can be a single insulation layer or composite insulation layer, and the material of the dielectric layer 118 is SiOx, SiNy, or SiOn, for instance. The second electrode 122 has a semiconductor layer and a heavily doped layer, and the material of the second electrode 122 can be hydrogen-containing amorphous silicon. The output electrode 130 can be a metal conductive layer same as the first electrode 116.

Figure 7:
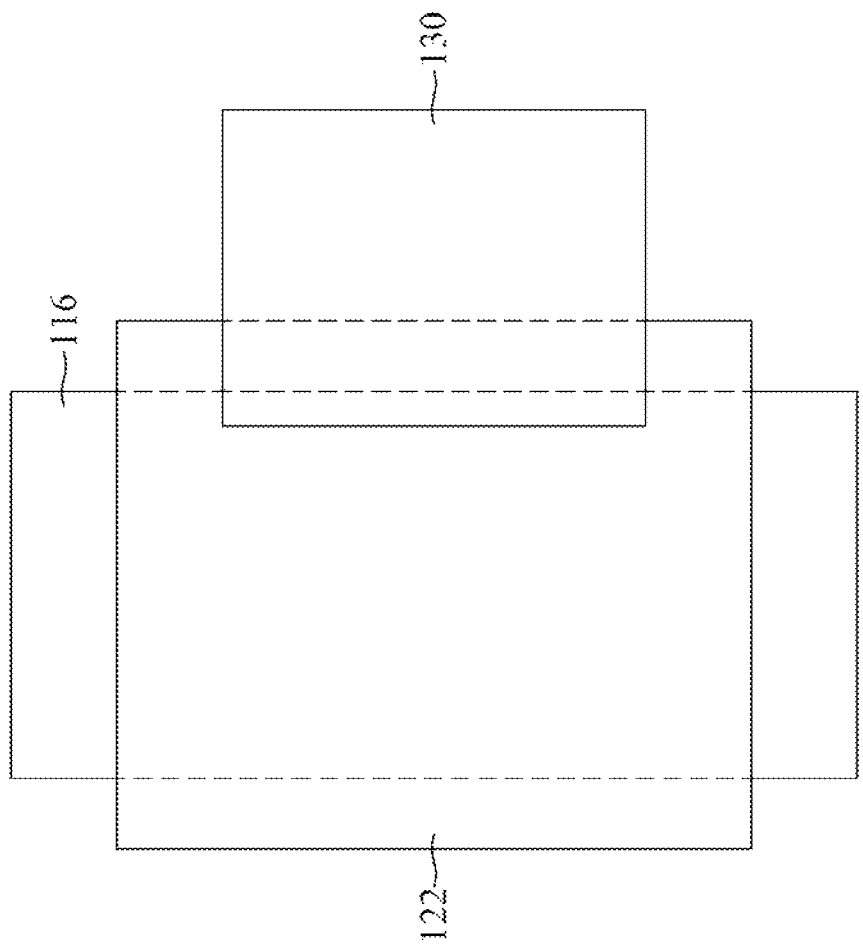
FIG. 7 is a vertical view of an exemplary embodiment of a detection capacitor.

A capacitor structure can be formed by two electrodes and the dielectric layer 118 between the two electrodes. FIG. 7 is a vertical view of an exemplary embodiment of a detection capacitor. Referring to FIG. 7, the first electrode 116 and the second electrode 122 are two conductive layers in the capacitor structure and separated by the dielectric layer 118 (not shown in FIG. 7). The area and sharp of the overlapped region between the two electrodes is modified according to the product requirements. For example, the sharp of the overlapped region is a circle, a rectangle, or irregular sharp. The area of the overlapped region may affect the variation value of the difference between the capacitance of the detection capacitor 108 illuminated by light and the capacitance of the detection capacitor 108 not illuminated by light. Thus, via appropriate design of the area or sharp of the overlapped region, there is significant difference between the capacitance of the detection capacitor 108 illuminated by light and the capacitance of the detection capacitor 108 not illuminated by light, thereby enhancing the sensitivity of the detection capacitor 108 when it illuminated by light. Moreover, the capacitance variation detected by the second electrode 122 is electrically connected to the corresponding data output line 119 through the output electrode 130. To prevent generation of parasitic capacitance between the data output line 119 and the first electrode 116 through the output electrode 130 to affect the accuracy of the detection capacitor 108, it is avoided that there is excessively large region between the output electrode 130 and the first electrode 116. For example, the output electrode 130 only contacts a side portion of the second electrode 122, so that only a small portion of the output electrode 130 overlaps the first electrode 116.

The detection capacitor 108 uses the amorphous silicon of the second electrode 122 to absorb photon and cause photoelectric effect for the detection. For example, when the pixel region is touched by a finger in the environment with sufficient external light, the location pressed by the finger blocks the external light. Thus, the amorphous silicon of the second electrode 122 of the detection capacitor 108 is not excited to cause the photoelectric effect, and the capacitance of the detection capacitor 108 is not varied. The amorphous silicon of other detection capacitors 108 of the touch display panel which are not illuminated by light generates photo-charges, and the photo-charges accumulate on the surface of the amorphous silicon, so that the capacitance of these detection capacitors 108 not illuminated by light is varied. Then, the value of the capacitance variation can be detected by using the corresponding data output line 119. Thus, a signal processor (not shown) is used to receive the capacitance difference values from the respective data output lines 119 to calculate the location where the finger touches. On the contrary, if the environment is a dark place, a backlight module of the display panel is used to provide a light source. At the location touched by a finger, the light is reflected by the finger and enters into the pixels in the touch region, so that the amorphous silicon of the corresponding detection capacitors 108 causes the capacitance variation due to the photoelectric effect. In the region where the finger does not touch, the capacitance of the detection capacitors 108 is not varies. Similarly, based on the capacitance output by the data output lines 119, the location where the finger touches can be obtained. According to the above operation, there are two different detection methods respectively applied for the light environment and the dark environment, and a signal processor is used with the two detection methods to process the information related capacitance variation transmitted by the data output lines 119, so that the touched location can be detected.

Significantly, the first electrode 116 not only serves as a capacitor electrode, but also blocks the light from the lower backlight module to prevent that the semiconductor material of the second electrode 122 is directly illuminated by the light from the backlight module in the normal condition to interference the light-sensing capability of the detection capacitor 108. In prior arts, an additional making object is required to achieve the above purpose. However, the design of the detection capacitor 108 subsumes the masking function, saving a step of forming an additional making object.

Figure 8:
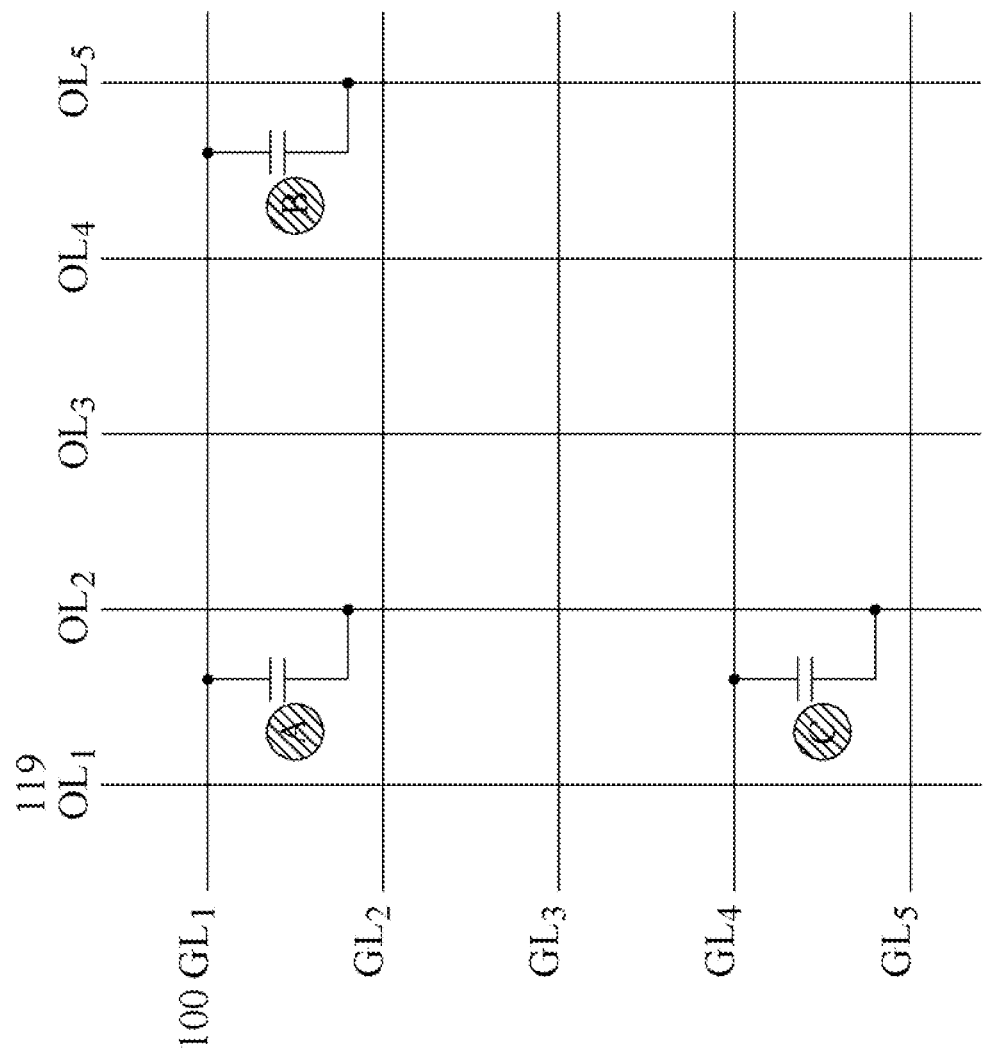
FIG. 8 illustrate multi-point touch by using an exemplary embodiment of a detection capacitor.

The detection capacitor 108 can also detect multi-point touch. Referring to FIG. 8, assume that a finger touches the pixels on the same row of the touch display panel, such as when a finger touch locations A and B simultaneously. When the gate line $GL_1$ performs the scan operation, the detection capacitors 108 on this row are driven. The capacitance at the locations A and B are varied due to the touching of the finger. The capacitance at the locations A and B is output through the data output lines $OL_2$ and $OL_5$ respectively, and, accordingly, a signal processor (not shown) can detect the touch locations. Assume that finger touches the pixels on the same column of the touch display panel, such as when a finger touches locations A and C simultaneously. When the gate line $GL_1$ is turned on, the data output line $OL_2$ detects capacitance variation. With the gate lines are scanned downward sequentially, when the gate line $GL_4$ is scanned, the data output line $OL_2$ also detects capacitance variation. A signal processor receives information of the capacitance variation in the different time, thereby detection the locations in the multi-point touching.

Except the above advantages, the detection capacitors 108 of the embodiment can be integrated into the current process for forming the thin film transistor array. FIGS. 2-6 show a manufacture method of an exemplary embodiment of a touch display panel by using normal five photo-mask processes, wherein each figure shows one photo-mask process. First, referring to FIG. 2, a first metal layer (not shown) is deposited on a substrate 110, and then the first metal layer is patterned via a first photo-mask to form a gate line (not shown), a gate 112 of a thin film transistor 104, a bottom storage electrode 144 of a storage capacitor 10, and a first electrode 116 of a detection capacitor 108.

Figure 3:
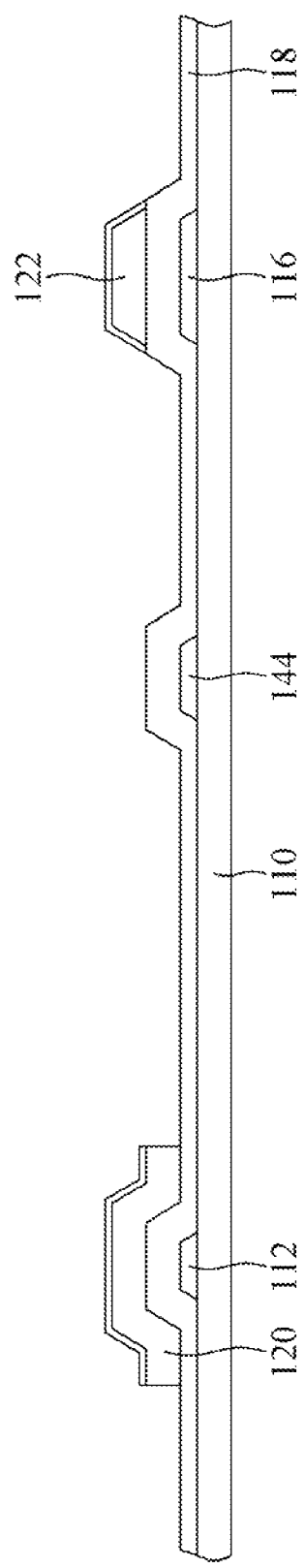

As shown in FIG. 3, a dielectric layer 118 is conformally deposited on the entire substrate 110 to serve as a gate insulation layer which covers the gate 112, the bottom storage electrode 144, and the first electrode 116. Then, a semiconductor layer and a heavy-doping semiconductor layer (not shown) are deposited, and the semiconductor layer the heavy-doping semiconductor layer are patterned via a second photo-mask to form a channel layer 120 of the thin film transistor 104 and a second electrode 122 of the detection capacitor 108. Thus, it is understood that the second electrode 122 of the detection capacitor 108 can comprise a semiconductor layer a heavy-doping semiconductor layer.

Figure 4:
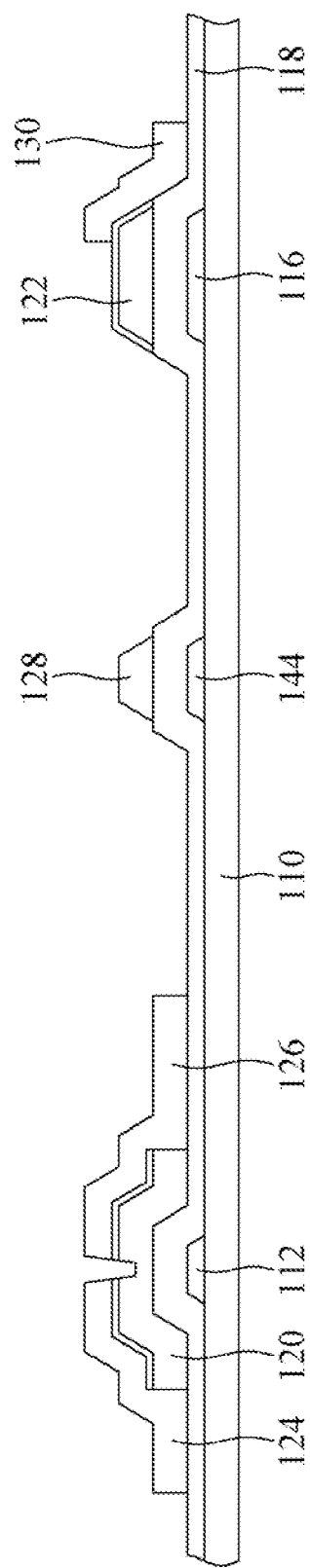

Then, referring to FIG. 4, a second metal layer (not shown) is conformally deposited on the entire substrate 110, and the second metal layer is patterned via a third photo-mask to form a data line (not shown), a source 124 and a drain 126 of the thin film transistor 104, a top storage electrode 128 of the storage capacitor 106, an data output line (not shown), and an output electrode 130 of the detection capacitor 108. The output electrode 130 covers the second electrode 122 to partly overlap the second electrode 122 to form coupling. The other terminal of the output electrode 120 is connected to the data output line 119.

Figure 5:
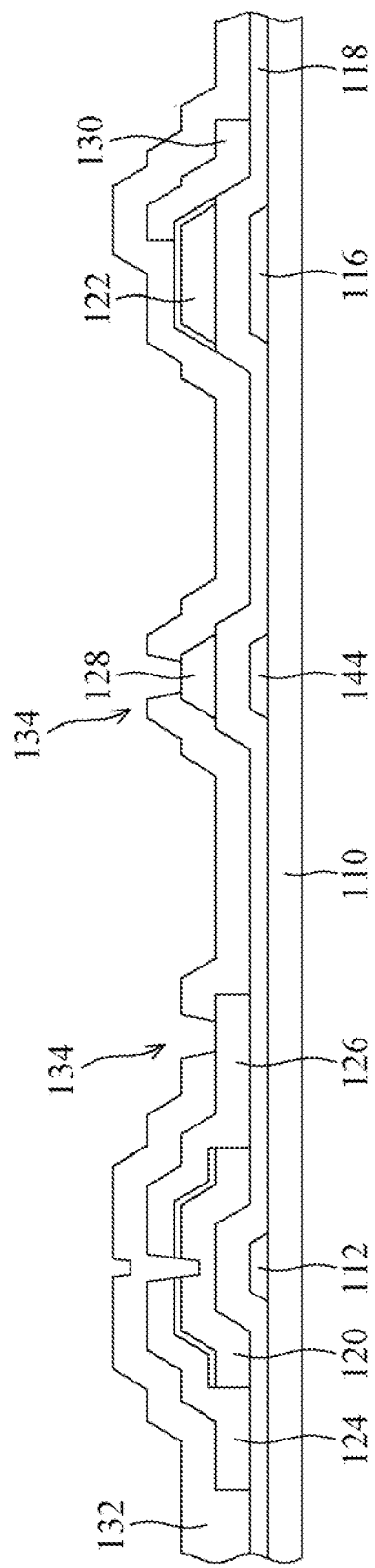

Next, referring to FIG. 5, a protection layer 132 is conformally deposited on the entire substrate 110, and then the protection layer 132 is patterned via a third photo-mask to form a connection via hole 134 on the protection layer 132 over the drain 126 and further a connection via hole 134 on the protection layer 132 over the top storage electrode 128 of the storage capacitor 106 to serve as holes for electrically connecting of following transparent thin film layers.

Referring to FIG. 6, a transparent conductive layer (not shown) is conformally deposited on the entire substrate 110, and then the transparent conductive layer is patterned via a fifth photo-mask to form a pixel electrode 136. The pixel electrode 136 fills into the connection via hole 134 to electrically connect the drain 126 and the top storage electrode 128.

Through the above steps, the thin film transistor 104, the storage capacitor 106, and the detection capacitor 108 are formed on the substrate 110 by the current five photo-mask processes. Thus, the manufacture method can be compatible with the current manufacture processes of thin film transistors without additional design and improvement.

Figure 9:
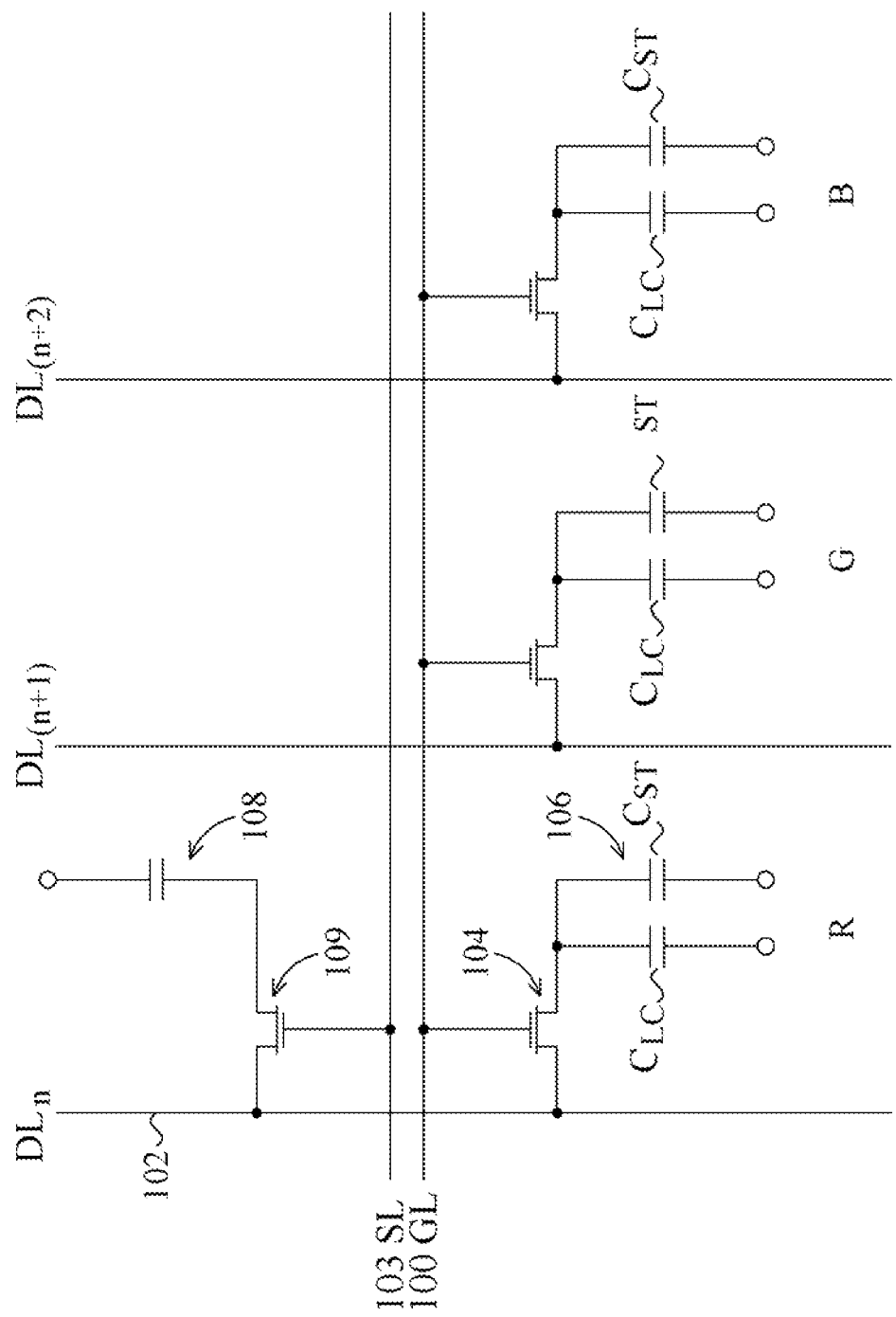
FIG. 9 shows a structure of an exemplary embodiment of a detection capacitor.
Figure 10:
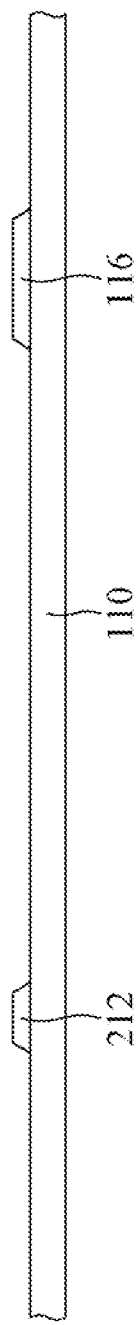
FIGS. 10-13 show a manufacture method of an exemplary embodiment of a detection capacitor.

FIG. 9 shows a structure of an exemplary embodiment of a detection capacitor. As shows in FIG. 9, a detection capacitor 108 can be driven through an auxiliary transistor 109, and the corresponding data line 102 serve as a signal output terminal of the detection capacitor 108. The first electrode 116 of the detection capacitor 108 is electrically connected to a common line (not shown) in the pixel, and the second electrode 122 thereof is electrically connected to the auxiliary transistor 109. A detection scan line (SL) 103 is used to turn on or turn off the auxiliary transistor 109, so that a signal representing capacitance variation is transmitted through the auxiliary transistor 109 to the corresponding data line 102 to serve as signal output. In the embodiment, since the auxiliary transistor 109 and the thin film transistor 104 which are disposed for one pixel share one data line 102, in order to avoid signal interruption, the scanning of the corresponding gate line 100 and the scanning of the corresponding detection scan line 103 are performed alternately. For example, when the gate lines 100 are scanned sequentially from the top to the bottom, the data lines 102 serve as signal input terminals of the respective thin film transistors 104, so that the thin film transistors can accomplish display operation according to the signals on the respective data line 104. After the top-bottom scanning operation of the gate lines 100 finishes, the detection scan lines 103 are scanned sequentially from the top to the bottom to turn on the respective auxiliary transistors 109 sequentially. At this time, the data lines 102 serve as signal output terminals of the respective detection capacitors 108, so that the capacitance of the detection capacitors 108 is output through the respective data lines 102. Accordingly, through different scanning timing, the data lines 102 can serve the signal input terminals of the thin film transistors 104 and the detection output terminals of the detection capacitors 108.

FIGS. 10-13 show a manufacture method of an exemplary embodiment of a detection capacitor. The formation of the auxiliary transistor 109 and the detection capacitor 108 is referred to FIGS. 10-13. First, referring to FIG. 10, a first metal layer (not shown) is deposited on a substrate 110, and then the first metal layer is patterned via a first photo-mask to form a gate line (not shown), a detection scan line (not shown), a gate 212 of the auxiliary transistor 109, a bottom storage electrode (not shown) of the storage capacitor 106, and a first electrode 116 of the detection capacitor 108.

Figure 11:
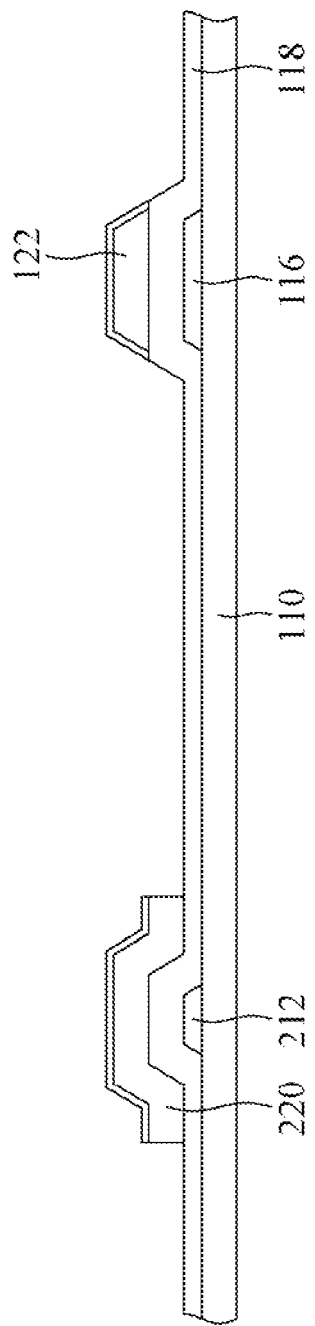
Figure 12:
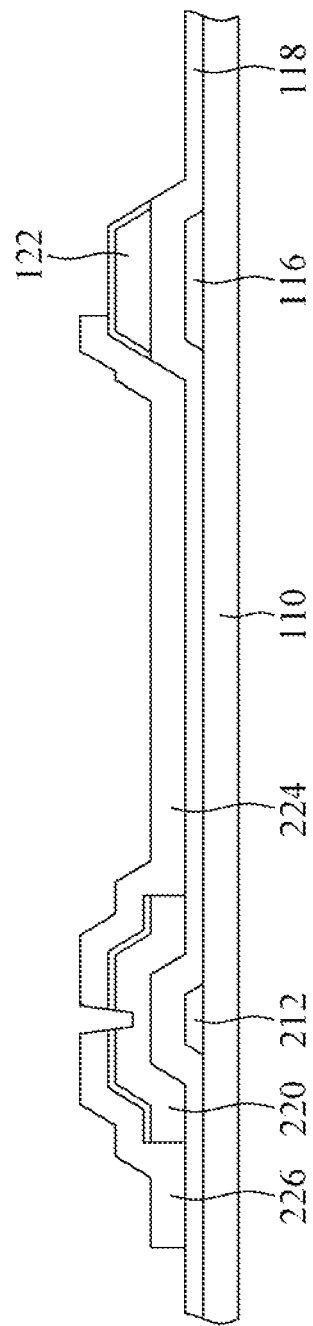
Figure 13:
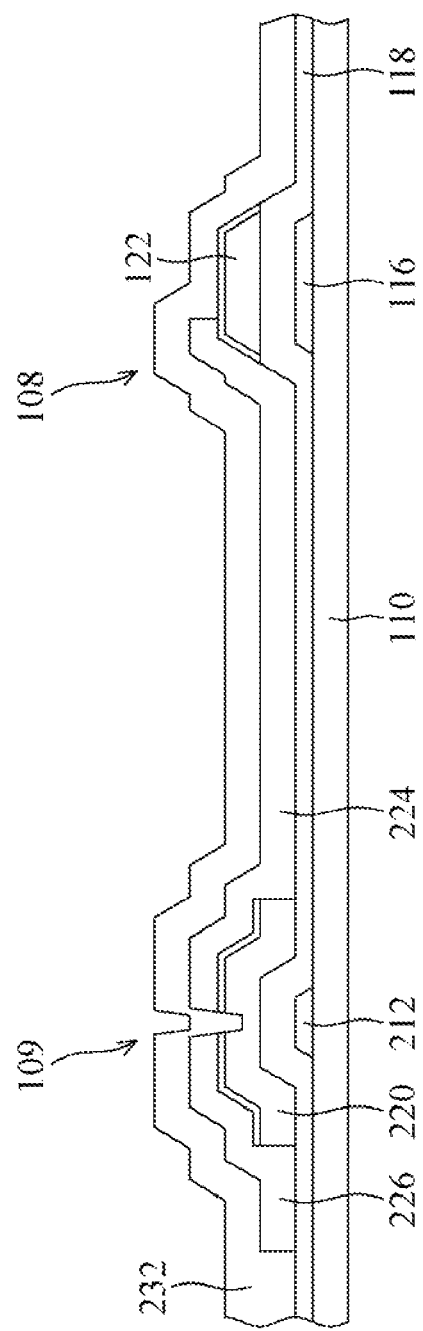

As shown in FIG. 11, a dielectric layer 118 is conformally deposited on the entire substrate 110 to serve as a gate insulation layer which covers the gate 212 and the first electrode 116. Then, a semiconductor layer a heavy-doping semiconductor layer (not shown) are deposited, and the semiconductor layer the heavy-doping semiconductor layer are patterned via a second photo-mask to form a channel layer 220 of the auxiliary transistor 109 and a second electrode 122 of the detection capacitor 108. Next, as shown in FIG. 12, a second metal layer (not shown) is conformally deposited on the entire substrate 110, and the second metal layer is patterned via a third photo-mask to form a data line (not shown), a source and a drain (not shown) of the thin film transistor 104, a top storage electrode (not shown) of the storage capacitor 106, and a source 224 and a drain 226 of the auxiliary transistor 109. The source 224 covers the second electrode 122 to partly overlap the second electrode 122 to form coupling.

Finally, a protection layer 132 is conformally deposited on the entire substrate 110. The structure of the detection capacitor is completed. Note that the steps of the manufacture method is described based on the formation of the auxiliary transistor 109 and the detection capacitor 108. One skilled in the art knows that when the auxiliary transistor 109 and the detection capacitor 108 are formed, the required thin film transistor 104 and storage capacitor 106 can also formed by referring to the steps and descriptions in FIGS. 2-5. Thus, the manufacture method in FIGS. 10-13 can be compatible with the current five photo-mask process.

According to the above description, in the structure of one detection capacitor in the embodiment, the semiconductor material generates a capacitance variation value after occurrence of photoelectric effect. Though the data output lines (or data lines) transmitting signals, the touched locations can be detected. According to the embodiment, the detection of multi-point touching can be performed. Further, compared with a light sensing element formed by a amorphous silicon thin film transistor, the elements in the touch display panel according to the embodiment are prevented from decline effect caused by long-time illumination, and the elements has longer useful life. Moreover, according to the embodiment, a signal amplifier is not required for each detection capacitor to amplify the signal representing the capacitance variation. Thus, there is no additional signal amplifier formed on the substrate, thereby increasing the aperture ratio of the and providing better display quality. Moreover, the manufacture method of the detection capacitor can be compatible with the current processes of the thin film transistor arrays without additional design and improvement.

While the disclosure has been described by way of example and in terms of the exemplary embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch display panel comprising:
a substrate;
a plurality of gate lines disposed on the substrate;
a plurality of data lines disposed on the substrate, wherein the data lines and the gate lines define a plurality of pixel regions on the substrate, wherein each pixel region is composed by adjacent two data lines and adjacent two gate lines;
a plurality of data output lines disposed on the substrate, wherein each data output line is disposed next to one data line;
a plurality of thin film transistors respectively disposed in the pixel regions, wherein each thin film transistor is electrically connected to a corresponding gate line and a corresponding data line; and
a plurality of detection capacitors respectively disposed in the pixel regions, wherein each detection capacitor includes a first electrode electrically connected to the corresponding gate line and a second electrode electrically connected to the corresponding data output line.

2. The touch display panel as claimed in claim 1, wherein each detection capacitor comprises:
the first electrode disposed on the substrate and electrically connected to the corresponding gate line;
the dielectric layer disposed on the first electrode;
a second electrode disposed on the dielectric layer, wherein the second electrode, the dielectric layer, and the first electrode form a capacitor structure; and
an output electrode electrically connected to the second electrode and the corresponding data output line.

3. The touch display panel as claimed in claim 2, wherein the second electrode is electrically connected to the output electrode through a side portion of the second electrode.

4. The touch display panel as claimed in claim 2, wherein the first electrode comprises metal.

5. The touch display panel as claimed in claim 2, wherein the second electrode comprises a semiconductor layer and a heavily doped layer.

6. The touch display panel as claimed in claim 2, wherein the second electrode comprises amorphous silicon.

7. The touch display panel as claimed in claim 2, wherein the output electrode comprises metal.

8. A touch display panel comprising:
a substrate;
a plurality of gate lines disposed on the substrate;
a plurality of data lines disposed on the substrate, wherein the data lines and the gate lines define a plurality of pixel regions on the substrate, wherein each pixel region is composed by adjacent two data lines and adjacent two gate lines;
a plurality of detection scan lines disposed on the substrate, wherein each detection scan line is disposed next to one scan line;
a plurality of common lines disposed on the substrate;
a plurality of thin film transistors respectively disposed in the pixel regions, wherein each thin film transistor is electrically connected to a corresponding gate line and a corresponding data line;
a plurality of auxiliary transistors respectively disposed in the pixel regions, wherein each auxiliary transistor is electrically connected to the corresponding detection scan line and the corresponding data line; and
a plurality of detection capacitors respectively disposed in the pixel regions, wherein each detection capacitor includes a first electrode electrically connected to a corresponding common line and a second electrode electrically connected to a corresponding auxiliary transistor.

9. The touch display panel as claimed in claim 8, wherein each auxiliary transistor comprises:
a gate disposed on the substrate and electrically connected to the corresponding detection scan line;
a dielectric layer disposed on the gate;
a source and a drain disposed on the dielectric layer, wherein the drain is electrically connected to the corresponding data line; and
a protection layer disposed on the source and the drain.

10. The touch display panel as claimed in claim 9, wherein each detection capacitor comprises:
   the first electrode disposed on the substrate and electrically connected to the corresponding common line;
   the dielectric layer disposed on the first electrode; and
   the second electrode disposed on the dielectric layer, wherein the second electrode, the dielectric layer, and the first electrode form a capacitor structure, and the source of the auxiliary transistor is electrically connected to the second electrode.

11. The touch display panel as claimed in claim 10, wherein the second electrode is electrically connected to the source of the auxiliary transistor through a side portion of the second electrode.

12. The touch display panel as claimed in claim 11, wherein the first electrode comprises metal.

13. The touch display panel as claimed in claim 10, wherein the second electrode comprises a semiconductor layer and a heavily doped layer.

14. The touch display panel as claimed in claim 9 further comprising an output, wherein the output electrode comprises metal.

* * * * *